United States Patent
Holder, Jr. et al.

(10) Patent No.: US 7,626,845 B2
(45) Date of Patent: Dec. 1, 2009

(54) VOLTAGE PROGRAMMING SWITCH FOR ONE-TIME-PROGRAMMABLE (OTP) MEMORIES

(75) Inventors: Clinton H. Holder, Jr., Slatington, PA (US); Kang W. Lee, Allentown, PA (US); Joseph E. Simko, Whitehall, PA (US); Yehuda Smooha, Allentown, PA (US); Ying Zhu, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 10 days.

(21) Appl. No.: 11/610,284

(22) Filed: Dec. 13, 2006

(65) Prior Publication Data
US 2008/0144350 A1 Jun. 19, 2008

(51) Int. Cl.
*G11C 17/00* (2006.01)
(52) U.S. Cl. .............. 365/96; 365/104; 365/189.16; 365/225.7; 326/101; 326/47; 326/38
(58) Field of Classification Search ............ 365/96, 365/104, 189.16, 225.7; 326/101, 47, 38
See application file for complete search history.

(56) References Cited

U.S. PATENT DOCUMENTS

| | | | | |
|---|---|---|---|---|
| 4,721,868 | A | | 1/1988 | Cornell et al. ............... 307/465 |
| 5,324,681 | A | * | 6/1994 | Lowrey et al. .............. 438/600 |
| 5,343,434 | A | * | 8/1994 | Noguchi ................ 365/185.04 |
| 5,392,246 | A | | 2/1995 | Akiyama et al. ............. 365/200 |
| 5,502,328 | A | * | 3/1996 | Chen et al. .................. 257/546 |
| 5,646,451 | A | | 7/1997 | Freyman et al. ............. 257/784 |
| 6,205,077 | B1 | | 3/2001 | Ferrant ................... 365/225.7 |
| 6,633,183 | B2 | * | 10/2003 | Duesman ..................... 326/47 |
| 6,741,500 | B2 | | 5/2004 | DeShazo et al. |
| 6,917,238 | B2 | | 7/2005 | Abe ........................... 327/525 |
| 2004/0239367 | A1 | | 12/2004 | Elappuparackal ........... 326/46 |
| 2005/0146373 | A1 | | 7/2005 | Yoon ......................... 327/525 |
| 2006/0158923 | A1 | * | 7/2006 | Namekawa et al. ......... 365/149 |
| 2007/0246737 | A1 | * | 10/2007 | Chang ....................... 257/107 |

OTHER PUBLICATIONS

M. Morris Mano, Digital Design, 2002, Prentice Hall, Third edition, p. 82.*

(Continued)

*Primary Examiner*—Hoai V Ho
*Assistant Examiner*—Fernando N Hidalgo
(74) *Attorney, Agent, or Firm*—Mendelsohn, Drucker & Associates, P.C.; Edward J. Meisarosh; Steve Mendelsohn

(57) ABSTRACT

In one embodiment, the invention is an integrated circuit (IC) including an OTP memory and conditioning circuitry. The IC receives an externally-generated DC programming voltage signal that the conditioning circuitry transforms into a programming pulse signal for programming the OTP memory. The conditioning circuitry includes: (i) reset protection circuitry for holding the programming pulse signal low if the IC is powering up, (ii) an overvoltage protection circuit for substantially preventing the programming pulse voltage from exceeding predefined boundaries, and (iii) a conversion switch for controlling the programming pulse voltage. The programming pulse voltage is (i) substantially equivalent to the externally-generated DC voltage if an enable signal is on, and (ii) substantially equivalent to a reference voltage if the enable signal is off.

41 Claims, 2 Drawing Sheets

OTHER PUBLICATIONS

A Novel Embedded OTP NVM Using Standard Foundry CMOS Logic Technology, www.icmtd.com, 2005 [retrieved on Nov. 3, 2006] Retrieved from the Internet: <URL: http://www.icmtd.com/Proceeding/ICMTD-2005/Session%20F/ICMTD2005%20-%20FP11.pdf> (2 pages).

Beating Flash Fallibility, www.newelectronics.co.uk, 2006 [retrieved on Nov. 3, 2006] Retrieved from the Internet: <URL: http://www.newelectronics.co.uk/articles/5721/beating-flash-fallibility.pdf> (2 pages).

On-Chip Nonvolatile Memory Proves Ideal for Consumer Applications, www.kilopass.com, 2005 [retrieved on Nov. 3, 2006] Retrieved from the Internet: <URL: http://www.kilopass.com/press/051805.html (4 pages).

* cited by examiner

| RSTB | EN | 301a | ENJ | NENJ | 401 | 402 | 403 | 203a |
|---|---|---|---|---|---|---|---|---|
| 0 | 0 | 1 | 0 | 1 | OFF | OFF | ON | $V_{SS}$ |
| 0 | 1 | 1 | 0 | 1 | OFF | OFF | ON | $V_{SS}$ |
| 1 | 0 | 1 | 0 | 1 | OFF | OFF | ON | $V_{SS}$ |
| 1 | 1 | 0 | 1 | 0 | ON | ON | OFF | PAD |

VOLTAGE PROGRAMMING SWITCH FOR ONE-TIME-PROGRAMMABLE (OTP) MEMORIES

BACKGROUND OF THE INVENTION

1. Field of the Invention

The current invention relates to electronic memories, and in particular, to the programming of one-time-programmable (OTP) memories.

2. Description of the Related Art

Integrated Circuits (ICs) typically use read-only memory (ROM) to store firmware and other information that does not typically need to be changed. ROM is a type of nonvolatile memory (NVM), i.e., ROM maintains its memory contents even after it is powered off. CMOS ICs can include CMOS-component ROM that is set in the masks used to create the IC. That ROM is consistent across all ICs produced from a particular mask set, but it is difficult to modify that ROM if the firmware changes late in the design process. Furthermore, after the production of an IC, that ROM is not field- or factory-programmable, and consequently, impossible to, e.g., (i) provide with a unique identification number and (ii) update with new firmware.

Alternatively, an IC can include programmable ROM (PROM), which is field-programmable. However, since PROM and CMOS components typically use different manufacturing processes, integrating the two types of components on a single IC die increases the complexity and cost of die manufacturing. Having the CMOS and PROM components on different dies does not increase die manufacturing costs and complexity for each die, but since two dies are required, system complexity and costs increase. For similar reasons, integrating CMOS components with EPROM (erasable PROM) or EEPROM (electronically erasable PROM) NVMs is also problematic.

One-time-programmable (OTP) memory refers to a type of NVM that uses standard CMOS components and can consequently be easily and cheaply integrated with a CMOS circuit on a single die. OTP memory consequently allows for the relatively simple and inexpensive integration on a CMOS IC of a field-programmable ROM. OTP memory can be used, for example, to store an identifier for an IC or store operational program code, such as firmware.

Several types of OTP memory have been developed. One example is XPM (from "eXtra Permanent Memory") from Kilopass Technology, Inc., of Santa Clara, Calif. XPM utilizes standard dual-oxide CMOS technology. XPM uses an antifuse principle for programming, wherein the conductivity characteristics of programmed components are transformed from a non-conductive state to a conductive state by the application of a sufficiently high voltage or current. An XPM memory cell comprises a thin-oxide transistor. The programming circuits are constructed using thick-oxide transistors. During programming, particular voltages are applied to selected transistors, which cause the gate oxide of those transistors to break down, thus programming the cell.

FIG. 1 shows a sample array of prior art OTP memory cells, comprising NMOS transistors 101, 102, 103, and 104. Vb1 and Vb2 are bit lines, Vwr1 and Vwr2 are read word lines, and Vwp1 and Vwp2 are program word lines. Suppose we want to program selected cell 101 without unintentionally programming unselected cells 102, 103, and 104. One way to do that is to hold (i) selected bit line Vb1 and unselected word lines Vwp2 and Vwr2 at ground potential, and (ii) selected read word line Vwr1 and unselected bit line Vb2 at the core power supply voltage of, e.g., 3.3V, while providing a short, e.g., 50 us, pulse on program word line Vwp1 at the programming voltage of, e.g., 3.3V.

The amplitude and width characteristics of the programming pulse provided on the program word lines are important because departures from specified characteristics could cause programming errors and reduced reliability of the OTP memory by not programming selected cells and/or unintentionally programming unselected cells. In some prior art OTP programming systems, the IC comprising the OTP memory also comprises voltage pump circuitry, which requires additional area and circuits on the IC and additional current to operate the voltage pump. In other prior art OTP programming systems, an external device allows a user to program OTP memory by providing pulses of precise voltage and timing characteristics. If the provided pulses do not have the appropriate characteristics, then irreversible programming errors could result.

If an OTP memory of an IC is programmed by the manufacturer of the IC, then the manufacturer is likely to possess the appropriate devices with the appropriate settings for proper programming of the OTP memory. However, if an OTP memory of an IC is programmed by a customer of the IC manufacturer, then the customer is less likely to have the appropriate equipment with the appropriate settings for proper programming of the OTP memory.

SUMMARY OF THE INVENTION

One embodiment of the invention is a novel technique for providing programming pulses to OTP memory cells, which reduces programming complexity, particularly for a customer of the IC manufacturer, as well as IC circuitry size, and power consumption. Another embodiment of the invention is a voltage programming switch located on an IC with OTP memory, wherein the voltage programming switch is adapted to perform the above novel technique.

In one embodiment, the invention is an integrated circuit (IC) comprising (i) a one-time-programmable (OTP) memory adapted to be programmed using a programming pulse signal, (ii) a pad adapted to receive an externally-generated DC programming voltage signal sufficient to program the OTP memory, and (iii) circuitry adapted to convert the externally-generated DC programming voltage signal into the programming pulse signal for application to the OTP memory.

In another embodiment, the invention is a method for programming OTP memory on an integrated circuit (IC), the method comprising (i) receiving an externally-generated DC programming voltage signal sufficient to program the OTP memory, and (ii) converting the externally-generated DC voltage signal into a programming pulse signal for programming the OTP memory.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
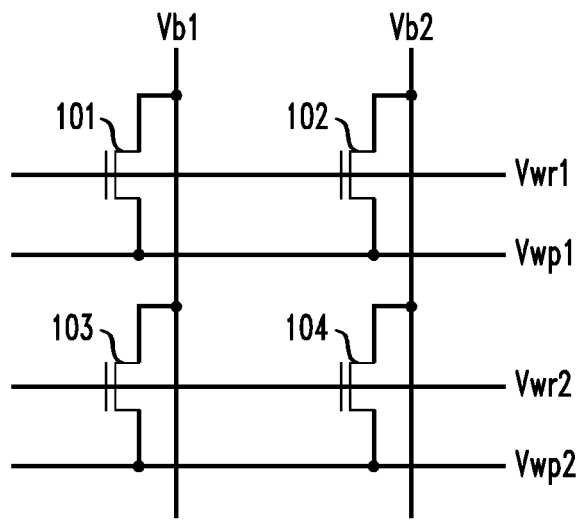
FIG. 1 shows a sample array of prior art XTP OTP memory cells.
Figure 2:
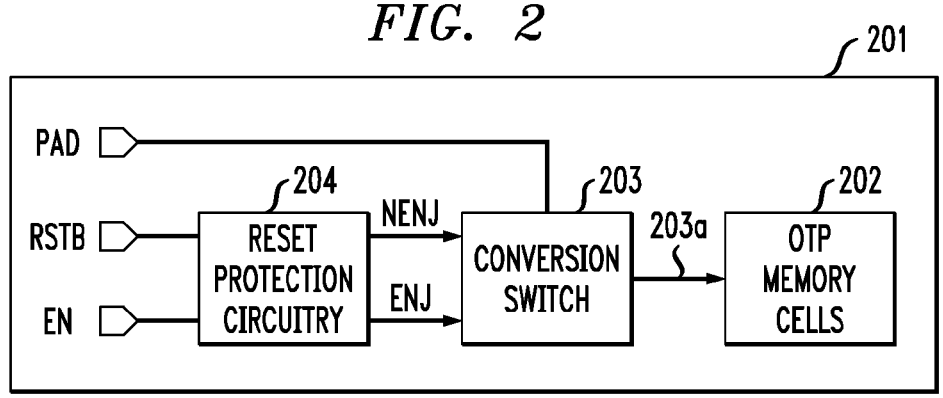
FIG. 2 shows a simplified block diagram of an integrated circuit in accordance with an embodiment of the present invention.

FIG. 2 shows a simplified block diagram of integrated circuit 201 in accordance with an embodiment of the present invention. IC 201 comprises OTP memory cells block 202, conversion switch 203, and reset protection circuitry 204. OTP memory cells block 202 comprises memory cells such as, e.g., those shown in FIG. 1. IC 201 provides a simplified interface for programming OTP memory cells block 202. Programming OTP memory cells block 202 does not require the provision of precisely-composed voltage pulses by an external device. Instead, IC 201 requires the simpler provision of a DC voltage of sufficient magnitude to program OTP memory cells block 202. Protection circuitry 204 and conversion switch 203 convert externally generated DC voltage signal PAD into appropriately shaped pulses in signal 203a for programming OTP memory cells block 202.

Reset protection circuitry 204 receives enable control signal EN and reset/bar signal RSTB as inputs, and outputs enable signal ENJ and not-enable signal NENJ, which are provided to conversion switch 203. Conversion switch 203 also receives programming voltage signal PAD as an input. Programming voltage signal PAD, which is provided by a source external to IC 201, is a DC voltage sufficient to program OTP memory cells in OTP memory cells block 202. Conversion switch 203 outputs programming pulse signal 203a to OTP memory cells block 202.

Reset/bar signal RSTB represents the logical opposite of the reset signal (not shown) of IC 201. When IC 201 is in the process of powering up, values of some signals on IC 201 may be indeterminate or at inappropriate levels. The reset signal, however, is set to be high while IC 201 is powering up, and then goes low after IC 201 has completed powering up and appropriate signals have stabilized. Thus reset/bar signal RSTB is low while IC 201 is powering up, then changes to high after IC 201 completes the power-up process, and stays high while IC 201 is powered up and is not reset.

Enable control signal EN, which is generated internal to IC 201, determines the width and duty cycle of programming pulse signal 203a provided to OTP memory cells in OTP memory cells block 202. Enable control signal EN is generated by circuitry (not shown) on IC 201, which also generates the other signals necessary to program OTP memory cells block 202, such as, e.g., Vb1, Vb2, Vwr1, Vwp1, Vwr2, and Vwp2 of FIG. 1. Enable control signal EN is designed to generate programming pulses appropriate for programming the OTP memory cells of OTP memory cells block 202.

Reset protection circuitry 204 receives enable control signal EN from which it produces two output signals: enable signal ENJ, which substantially follows enable control signal EN, and not-enable signal NENJ, which is substantially an inverse of enable signal ENJ. As used herein, the term "follow" and its variants, when used in reference to two signals, indicates that, if a first signal follows a second signal, then the first signal is high and low at substantially the same times as the second signal is high and low. Since the value of enable control signal EN may fluctuate unpredictably during the powering-up period of IC 201, reset protection circuitry 204 uses reset/bar signal RSTB to ignore enable control signal EN values during power-up. During power-up, reset protection circuitry 204 holds enable signal ENJ low and not-enable signal NENJ high. Reset protection circuitry 204 may also comprise a voltage translator (not shown) if needed to provide output signals at different voltage levels than the input voltage levels.

Conversion switch 203 uses enable signal ENJ and not-enable signal NENJ to determine the timing profile of programming pulse signal 203a. In an alternative embodiment, conversion switch 203 receives only enable signal ENJ or only not-enable signal NENJ and generates the other signal by inverting or at least substantially inverting the signal it receives. If ENJ is high, then conversion switch 203 provides a voltage corresponding to programming voltage signal PAD to OTP memory cells array 202 as programming pulse signal 203a. If ENJ is low, then conversion switch 203 holds programming pulse signal 203a low.

Figure 3:
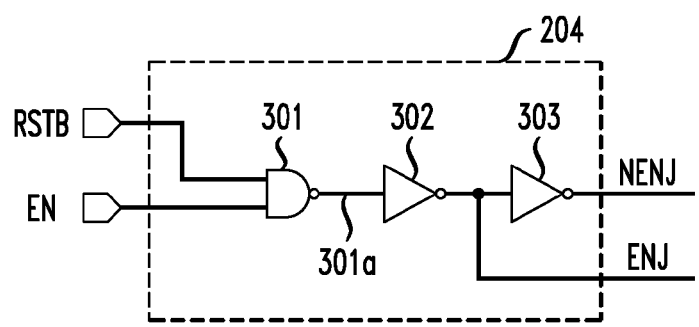
FIG. 3 shows a simplified schematic diagram of an implementation of reset protection circuitry 204 of FIG. 2.

FIG. 3 shows a simplified schematic diagram of an implementation of reset protection circuitry 204 of FIG. 2. Reset protection circuitry 204 comprises NAND gate 301, and inverters 302 and 303. Reset protection circuitry 204 receives as inputs enable control signal EN and reset/bar signal RSTB. Enable control signal EN and reset/bar signal RSTB are input to NAND gate 301. Output 301a of NAND gate 301 is high when reset/bar signal RSTB is low, and is the inverse of enable control signal EN when reset/bar RSTB is high. Output 301a goes into inverter 302, which in turn generates enable signal ENJ. Enable signal ENJ is output by reset protection circuitry 204, and is also provided to inverter 303, which in turn generates not-enable signal NENJ. Not-enable signal NENJ is output by reset protection circuitry 204. In an alternative embodiment, reset protection circuitry 204 does not comprise inverter 303, and not-enable signal NENJ is provided by NAND gate 301 as equivalent to output 301a.

Figures 4, 5:
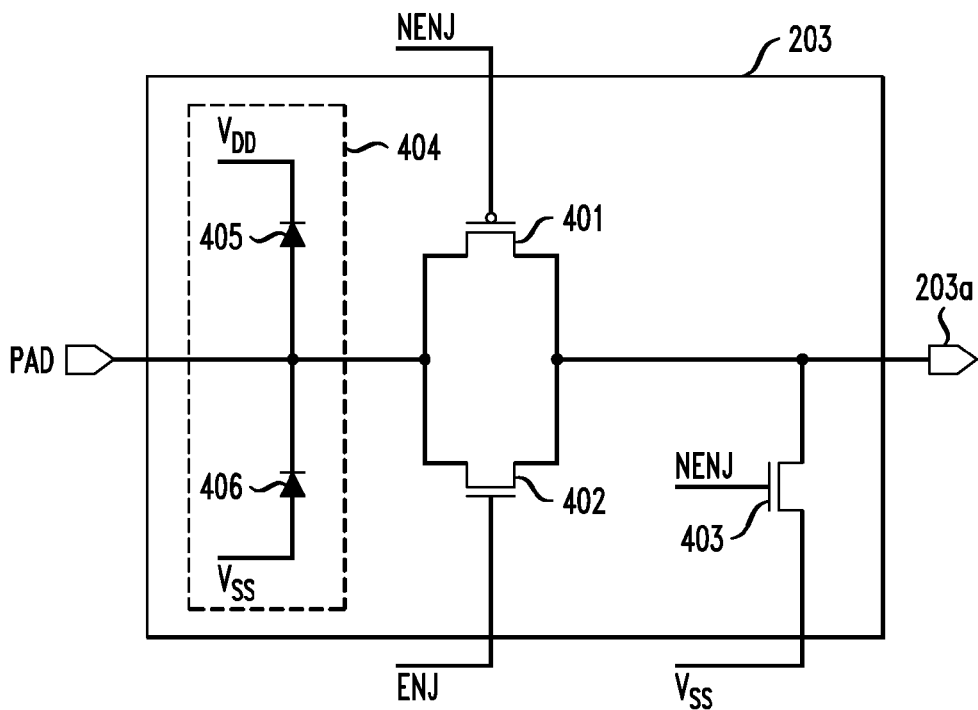
FIG. 4 shows a simplified schematic diagram of an implementation of the conversion switch of FIG. 2.
FIG. 5 shows a truth table for signals in FIG. 3 combined with an operation table for signals and elements in FIG. 4.

FIG. 4 shows a simplified schematic diagram of an implementation of conversion switch 203 of FIG. 2. Conversion switch 203 comprises transistors 401, 402, and 403, and optional overvoltage protection circuit 404. Conversion switch 203 receives programming voltage signal PAD, enable signal ENJ, and not-enable signal NENJ as inputs, and provides programming pulse signal 203a as an output.

Programming voltage signal PAD passes through overvoltage protection circuit 404. Overvoltage protection circuit 404 is designed to keep voltages inside conversion switch 203 within a specified range, e.g., between $V_{SS}$ and $V_{DD}$. Programming voltage signal PAD is connected via diode 406 to reference voltage $V_{SS}$, which is typically set to ground potential, so that, if the voltage level of programming voltage signal PAD drops below $V_{SS}$ by at least the threshold voltage of diode 406, then diode 406 turns on, consequently keeping programming voltage signal PAD at or near $V_{SS}$. Programming voltage signal PAD is connected via diode 405 to power supply voltage $V_{DD}$, which in one application is set to approximately 3.3V, so that, if the voltage level of programming voltage signal PAD rises above $V_{DD}$ by at least the threshold voltage of diode 405, then diode 405 turns on, consequently keeping programming voltage signal PAD at or near $V_{DD}$.

Programming voltage signal PAD is connected to the source terminals of PMOS transistor 401 and NMOS transistor 402. The gate of PMOS transistor 401 is connected to not-enable signal NENJ. The gate of NMOS transistor 402 is connected to enable signal ENJ. The drain terminals of transistors 401 and 402 are connected together and to the drain terminal of NMOS transistor 403, together generating programming pulse signal 203a as an output of conversion switch 203. The source terminal of transistor 403 is connected to reference voltage $V_{SS}$, and the gate of transistor 403 is connected to not-enable signal NENJ.

If ENJ is high, then NENJ is low, transistors 401 and 402 are on, and transistor 403 is off. Consequently, programming pulse signal 203a is substantially equal to programming voltage signal PAD when ENJ is high. If ENJ is low, then NENJ is high, transistors 401 and 402 are off, and transistor 403 is on. Consequently, programming pulse signal 203a is substantially equal to $V_{SS}$ when ENJ is low. Thus, programming pulse signal 203a follows enable signal ENJ, with a high voltage level approximately equal to programming voltage signal PAD and a low voltage level approximately equal to $V_{SS}$.

FIG. 5 shows a truth table for signals in FIG. 3 combined with an operation table for signals and elements in FIG. 4. If RSTB and EN are both high, then output 301a is low, ENJ is high, NENJ is low, transistors 401 and 402 are on, transistor 403 is off, and programming pulse signal 203a is at voltage PAD. Otherwise, if RSTB and EN are not both high, then output 301a is high, ENJ is low, NENJ is high, transistors 401 and 402 are off, transistor 403 is on, and output 203a is at voltage $V_{SS}$. In other words, programming pulse signal 203a follows enable control signal EN if RSTB is high, wherein programming pulse signal varies from $V_{SS}$ to PAD, otherwise programming pulse signal 203a is held at $V_{SS}$.

In an alternative embodiment, conversion switch 203 of FIG. 2 receives only enable signal ENJ or only not-enable signal NENJ and does not invert the signal it receives. Instead, conversion switch 203 uses alternative elements that function as desired with the non-inverted signal.

Exemplary embodiments of the invention have been provided using PMOS and NMOS FETs. As would be appreciated by a person of ordinary skill in the art, a particular transistor can be replaced by many other kinds of transistors, with appropriate inversions of signals, orientations, or voltages, as necessary, and without departing from the scope of the invention.

Exemplary embodiments of the invention have been provided using an OTP memory cells block, however the invention is not limited to a single cohesive block of OTP memory cells on an IC. The IC may contain several separate blocks of OTP memory cells which may share shareable circuitry such as a conversion switch, reset protection circuitry, and/or other common circuitry, or may each have their own shareable circuitry, or may be arranged so that some blocks of OTP memory cells share some shareable circuitry while others do not share that shareable circuitry.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

For purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

We claim:

1. An integrated circuit (IC) comprising:
  a one-time-programmable (OTP) memory adapted to be programmed using a programming pulse signal;
  a pad adapted to receive an externally-generated DC programming voltage signal sufficient to program the OTP memory; and
  circuitry adapted to convert the externally-generated DC programming voltage signal into the programming pulse signal for application to the OTP memory, wherein:
    the OTP memory comprises at least one OTP memory cell;
    the programming pulse signal is provided directly to the at least one OTP memory cell; and the magnitude of the programming pulse signal is no less than any other signal applied directly to the at least one OTP memory cell.

2. The IC of claim 1, wherein converting comprises having the programming pulse signal follow an internally-generated enable control signal.

3. The IC of claim 2, wherein the circuitry comprises a conversion switch adapted to:
receive the externally-generated DC programming voltage signal and an enable signal based on the enable control signal; and
generate at an output node the programming pulse signal based on the externally-generated DC programming voltage signal and the enable signal.

4. The IC of claim 3, wherein the conversion switch comprises an overvoltage protection circuit adapted to protect the OTP memory from overvoltage in the externally-generated DC programming voltage signal.

5. The IC of claim 4, wherein the overvoltage protection circuit comprises:
a first diode connected to a power supply voltage and adapted to turn on if the externally-generated DC programming voltage signal exceeds the power supply voltage by at least a first diode threshold voltage; and
a second diode connected to a reference voltage and adapted to turn on if the externally-generated DC programming voltage signal drops below the reference voltage by at least a second diode threshold voltage.

6. The IC of claim 3, wherein the enable signal further depends on a reset signal for the IC.

7. The IC of claim 3, wherein the conversion switch comprises:
a first transistor connected between the pad and the output node, and controlled by a signal corresponding to an inverse of the enable signal;
a second transistor connected between the pad and the output node, and controlled by the enable signal; and
a third transistor connected between the output node and a reference voltage, and controlled by the signal corresponding to the inverse of the enable signal.

8. The IC of claim 7, wherein:
the first transistor is a PMOS transistor; and
the second and third transistors are NMOS transistors.

9. The IC of claim 2, wherein the circuitry comprises reset protection circuitry-adapted to:
receive a reset signal for the IC and the enable control signal; and
provide an enable signal that corresponds to (i) the enable control signal if the reset signal indicates that the IC has completed powering up, and (ii) a reference voltage if the reset signal indicates that the IC has not completed powering up.

10. The IC of claim 9, wherein the reset protection circuitry is further adapted to provide a signal corresponding to an inverse of the enable signal.

11. The IC of claim 10, wherein the reset protection circuitry comprises:
a NAND gate connected to receive the enable control signal and the reset signal; and
one or more inverters connected in series to the NAND gate output, and adapted to generate the enable signal and the inverse of the enable signal based on the output of the NAND gate.

12. The IC of claim 1, wherein converting comprises holding the programming pulse signal at a reference voltage if the IC has not completed powering up.

13. The IC of claim 12, wherein a reset signal indicates whether the IC has or has not completed powering up.

14. The IC of claim 1, wherein converting comprises keeping the voltage level of the programming pulse signal within defined voltage limits.

15. The IC of claim 1, wherein converting comprises:
having the programming pulse signal follow an internally-generated enable control signal if the IC has completed powering up;
holding the programming pulse signal at a reference voltage if the IC has not completed powering up; and
keeping the voltage level of the programming pulse signal within defined voltage limits.

16. The IC of claim 15, wherein the circuitry comprises:
reset protection circuitry adapted to:
receive a reset signal for the IC and the enable control signal;
provide an enable signal that corresponds to (i) the enable control signal if the reset signal indicates that the IC has completed powering up, and (ii) a reference voltage if the reset signal indicates that the IC has not completed powering up; and
provide a signal corresponding to an inverse of the enable signal; and
a conversion switch comprising an overvoltage protection circuit adapted to protect the OTP memory from overvoltage in the externally-generated DC programming voltage signal, wherein the conversion switch is adapted to:
receive the externally-generated DC programming voltage signal, the enable signal, and the inverse of the enable signal; and
generate at an output node the programming pulse signal based on the externally-generated DC programming voltage signal, the enable signal, and the inverse of the enable signal.

17. The IC of claim 16, wherein:
the reset protection circuitry comprises:
a NAND gate connected to receive the enable control signal and the reset signal; and
one or more inverters connected in series to the NAND gate output, and adapted to generate the enable signal and the inverse of the enable signal based on the output of the NAND gate;
the conversion switch comprises:
a first transistor connected between the pad and the output node, and controlled by the inverse of the enable signal;
a second transistor connected between the pad and the output node, and controlled by the enable signal; and
a third transistor connected between the output node and a reference voltage, and controlled by the inverse of the enable signal; and
the overvoltage protection circuit comprises:
a first diode connected to a power supply voltage and adapted to turn on if the externally-generated DC programming voltage signal exceeds the power supply voltage by at least a first diode threshold voltage; and
a second diode connected to the reference voltage and adapted to turn on if the externally-generated DC programming voltage signal drops below the reference voltage by at least a second diode threshold voltage.

18. A method for programming OTP memory on an integrated circuit (IC), the method comprising:

receiving an externally-generated DC programming voltage signal sufficient to program the OTP memory; and converting the externally-generated DC voltage signal into a programming pulse signal for programming the OTP memory, wherein:

the OTP memory comprises at least one OTP memory cell;

the programming pulse signal is provided directly to the at least one OTP memory cell; and the magnitude of the programming pulse signal is no less than any other signal applied directly to the at least one OTP memory cell.

19. The method of claim 18, wherein the converting comprises having the programming pulse signal follow an internally-generated enable control signal.

20. The method of claim 19, wherein the method comprises:

providing to the OTP memory, the programming pulse signal based on the externally-generated DC programming voltage signal and an enable signal based on the enable control signal.

21. The method of claim 20, wherein the method comprises protecting the OTP memory from overvoltage in the externally-generated DC programming voltage signal.

22. The method of claim 20, wherein the step of providing the programming pulse signal is further based on a reset signal for the IC.

23. The method of claim 19, wherein the method comprises:

receiving a reset signal for the IC and the enable control signal;

providing an enable signal that corresponds to (i) the enable control signal if the reset signal indicates that the IC has completed powering up, and (ii) a reference voltage if the reset signal indicates that the IC has not completed powering up.

24. The method of claim 23, further comprising the step of providing a signal corresponding to an inverse of the enable signal.

25. The method of claim 18, wherein the step of converting comprises holding the programming pulse signal at a reference voltage if the IC has not completed powering up.

26. The method of claim 25, wherein a reset signal indicates whether the IC has or has not completed powering up.

27. The method of claim 18, wherein the converting step comprises keeping the voltage level of the programming pulse signal within defined voltage limits.

28. The method of claim 18, wherein the converting step comprises:

having the programming pulse signal follow an internally-generated enable control signal if the IC has completed powering up;

holding the programming pulse signal at a reference voltage if the IC has not completed powering up; and keeping the voltage level of the programming pulse signal within defined voltage limits.

29. The method of claim 28, wherein the converting step comprises:

receiving a reset signal for the IC and the enable control signal;

providing an enable signal that corresponds to (i) the enable control signal if the reset signal indicates that the IC has completed powering up, and (ii) a reference voltage if the reset signal indicates that the IC has not completed powering up; and providing a signal corresponding to an inverse of the enable signal.

30. The method of claim 18, wherein the externally-generated DC voltage signal is converted into the programming pulse signal for direct provision to the OTP memory without employing any voltage pumping.

31. The method of claim 18, wherein the high value of the programming pulse signal is substantially equal to the high value of the externally-generated DC programming voltage signal.

32. The IC of claim 1, wherein the integrated circuit does not include a voltage pump connected between the pad and the OTP memory.

33. The IC of claim 1, wherein the circuitry is adapted to convert the externally-generated DC programming voltage signal into the programming pulse signal such that the high value of the programming pulse signal is substantially equal to the high value of the externally-generated DC programming voltage signal.

34. An integrated circuit (IC) comprising:

a one-time-programmable (OTP) memory adapted to be programmed using a programming pulse signal;

a pad adapted to receive an externally-generated DC programming voltage signal sufficient to program the OTP memory; and circuitry adapted to convert the externally-generated DC programming voltage signal into the programming pulse signal for application to the OTP memory, wherein:

converting comprises having the programming pulse signal follow an internally-generated enable control signal;

the circuitry comprises a conversion switch adapted to:

receive the externally-generated DC programming voltage signal and an enable signal based on the enable control signal; and generate at an output node the programming pulse signal based on the externally-generated DC programming voltage signal and the enable signal; and the conversion switch comprises:

a first transistor connected between the pad and the output node, and controlled by a signal corresponding to an inverse of the enable signal;

a second transistor connected between the pad and the output node, and controlled by the enable signal; and a third transistor connected between the output node and a reference voltage, and controlled by the signal corresponding to the inverse of the enable signal.

35. The IC of claim 34, wherein:

the first transistor is a PMOS transistor; and the second and third transistors are NMOS transistors.

36. An integrated circuit (IC) comprising:

a one-time-programmable (OTP) memory adapted to be programmed using a programming pulse signal;

a pad adapted to receive an externally-generated DC programming voltage signal sufficient to program the OTP memory; and circuitry adapted to convert the externally-generated DC programming voltage signal into the programming pulse signal for application to the OTP memory, wherein:

convening comprises having the programming pulse signal follow an internally-generated enable control signal; and the circuitry comprises reset protection circuitry adapted to:

receive a reset signal for the IC and the enable control signal; and provide an enable signal that corresponds to (i) the enable control signal if the reset signal indicates that the IC has completed powering up, and (ii) a reference voltage if the reset signal indicates that the IC has not completed powering up.

37. The IC of claim 36, wherein the reset protection circuitry is further adapted to provide a signal corresponding to an inverse of the enable signal.

38. The IC of claim 37, wherein the reset protection circuitry comprises:

a NAND gate connected to receive the enable control signal and the reset signal; and one or more inverters connected in series to the NAND gate output, and adapted to generate the enable signal and the inverse of the enable signal based on the output of the NAND gate.

39. A method for programming OTP memory on an integrated circuit (IC), the method comprising:

receiving an externally-generated DC programming voltage signal sufficient to program the OTP memory; and converting the externally-generated DC voltage signal into a programming pulse signal for programming the OTP memory, wherein:

the converting comprises having the programming pulse signal follow an internally-generated enable control signal; and the method comprises:

receiving a reset signal for the IC and the enable control signal; and providing an enable signal that corresponds to (i) the enable control signal if the reset signal indicates that the IC has completed powering up, and (ii) a reference voltage if the reset signal indicates that the IC has not completed powering up.

40. The method of claim 39, further comprising the step of providing a signal corresponding to an inverse of the enable signal.

41. A method for programming OTP memory on an integrated circuit (IC), the method comprising:

receiving an externally-generated DC programming voltage signal sufficient to program the OTP memory; and converting the externally-generated DC voltage signal into a programming pulse signal for programming the OTP memory, wherein:

the converting step comprises:

having the programming pulse signal follow an internally-generated enable control signal if the IC has completed powering up;

holding the programming pulse signal at a reference voltage if the IC has not completed powering up;

keeping the voltage level of the programming pulse signal within defined voltage limits;

receiving a reset signal for the IC and the enable control signal;

providing an enable signal that corresponds to (i) the enable control signal if the reset signal indicates that the IC has completed powering up, and (ii) a reference voltage if the reset signal indicates that the IC has not completed powering up; and providing a signal corresponding to an inverse of the enable signal.

* * * * *